(12) United States Patent
Chen et al.

(10) Patent No.: US 9,722,630 B1
(45) Date of Patent: Aug. 1, 2017

(54) DECODING APPARATUS AND METHOD FOR DECODING A SERIALLY TRANSMITTED SIGNAL THEREOF

(71) Applicant: ANDES TECHNOLOGY CORPORATION, Hsin-Chu (TW)

(72) Inventors: Zhong-Ho Chen, Miaoli County (TW); Tien-Yu Chang, Taipei (TW)

(73) Assignee: ANDES TECHNOLOGY CORPORATION, Hsin-Chu (TW)

( * ) Notice: Subject to any disclaimer, the term of this patent is extended or adjusted under 35 U.S.C. 154(b) by 0 days.

(21) Appl. No.: 15/470,935

(22) Filed: Mar. 28, 2017

(51) Int. Cl.
*H03M 7/00* (2006.01)
*H03M 7/30* (2006.01)

(52) U.S. Cl.
CPC .................................. *H03M 7/30* (2013.01)

(58) Field of Classification Search
CPC ................................. H03M 7/30; H03M 7/00
USPC ..................................... 341/50, 51, 100, 101
See application file for complete search history.

(56) References Cited

U.S. PATENT DOCUMENTS

| | | | | |
|---|---|---|---|---|
| 3,238,298 A * | 3/1966 | Willis | ....................... | G06F 3/00 370/299 |
| 5,742,644 A * | 4/1998 | Campana, Jr. | ........... | H04B 7/10 370/503 |
| 5,751,773 A * | 5/1998 | Campana, Jr. | ........... | H04B 7/10 370/503 |
| 5,761,254 A | 6/1998 | Behrin | | |
| 6,081,783 A * | 6/2000 | Divine | .................... | H03M 7/30 704/201 |
| 6,198,783 B1 * | 3/2001 | Campana, Jr. | ........... | H04B 7/10 375/219 |
| 6,272,569 B1 * | 8/2001 | Nordling | ............... | G06F 13/385 710/29 |
| 6,611,219 B1 | 8/2003 | Lee et al. | | |
| 6,944,248 B2 | 9/2005 | Sullivan | | |
| 7,746,971 B2 * | 6/2010 | Masui | ................... | H03L 7/0995 375/355 |
| 8,396,180 B2 * | 3/2013 | Ribo | .................... | H04L 7/0337 370/338 |

* cited by examiner

*Primary Examiner* — Jean B Jeanglaude
(74) *Attorney, Agent, or Firm* — Jianq Chyun IP Office

(57) ABSTRACT

The method for decoding a serially transmitted signal including: sampling the serially transmitted signal to obtain a plurality of sampled values according to a sampling period; obtaining a period of the serially transmitted signal according to a transition status of the sampled values; calculating a plurality of phase values according to the period and the transition status of the sampled values; obtaining a plurality of boundaries according to the phase values; and outputting a decoded data according to the boundaries and the transition status.

18 Claims, 9 Drawing Sheets

DECODING APPARATUS AND METHOD FOR DECODING A SERIALLY TRANSMITTED SIGNAL THEREOF

BACKGROUND

Field of the Invention

The invention relates to a data decoding apparatus and a method for decoding a serially transmitted signal thereof. Particularly, the invention relates to the method to detect a plurality boundaries of the serially transmitted signal without information about a clock frequency of a transmitter for encoding the serially transmitted signal.

Description of Related Art

For transmitting data with serially transmitted signal, a synchronous data transmission scheme and an asynchronous data transmission scheme are provided in convention art. Please referring to FIGS. 1A and 1B, wherein FIG. 1A illustrates a block diagram of the synchronous data transmission scheme, and FIG. 1B illustrates a block diagram of the asynchronous data transmission scheme. In FIG. 1A, a transmitter 110 and a receiver 120 are provided, and the transmitter 110 is coupled to the receiver 120. The transmitter 110 transmits a clock signal CLK and a serially transmitted signal DS to the receiver 120. The serially transmitted signal DS and the clock signal CLK are synchronous, and the receiver 120 can decode data carried on the serially transmitted signal DS according to the clock signal CLK.

In FIG. 1B, FIG. 1B provides a transmitter 130 and a receiver 140. The transmitter 130 is coupled to the receiver 140, and the transmitter 130 encodes transmitting data according to a clock signal CLKT for generating a serially transmitted signal DS. The transmitter 130 transmits the serially transmitted signal DS to the receiver 140. The receiver 140 can decode the serially transmitted signal DS to obtain the transmitting data according to a clock CLKR. It should be noted here, the clock CLKR of the receiver 140 is generated according to a clock frequency of the clock signal CLKT of the transmitter 130.

Such as that, in both of the synchronous data transmission scheme and the asynchronous data transmission scheme of conventional art, the receiver needs to know the clock frequency of the clock signal of the transmitter. Furthermore, it is required that the transmitter must have high bit rate accuracy. Specially, in high-speed universal serial bus (USB), the required accuracy of the transmitter is 480 Mbps+−0.05% (500 ppm).

SUMMARY OF THE INVENTION

The invention is directed to a data decoding apparatus and a method for decoding a serially transmitted signal, and the data decoding apparatus does not need to know a frequency of the transmitter.

The present disclosure provides the method for decoding a serially transmitted signal including: sampling the serially transmitted signal to obtain a plurality of sampled values according to a sampling period; obtaining a period of the serially transmitted signal according to a transition status of the sampled values; calculating a plurality of phase values according to the period and the transition status of the sampled values; obtaining a plurality of boundaries according to the phase values; and outputting a decoded data according to the boundaries and the transition status.

The present disclosure provides the data decoding apparatus including a signal sampler and a controller. The signal sampler samples the serially transmitted signal to obtain a plurality of sampled values according to a sampling period. The controller is coupled to the signal sampler, and the controller is configure to: obtain a period of the serially transmitted signal according to a transition status of the sampled values; calculate a plurality of phase values according to the period and the transition status of the sampled values; obtain a plurality of boundaries according to the phase values; and, output a decoded data according to the boundaries and the transition status.

The present invention provides the method for decoding a serially transmitted signal to detect a plurality boundaries of the serially transmitted signal, and a plurality of output data can be generated by reference to the boundaries. Such as that, a clock frequency of a transmitter for encoding the serially transmitted signal is not necessary for the data decoding apparatus in advance.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
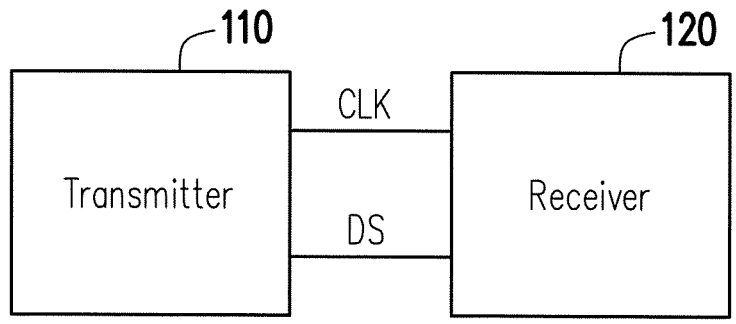
FIG. 1A illustrates a block diagram of the synchronous data transmission scheme.
Figure 1B:
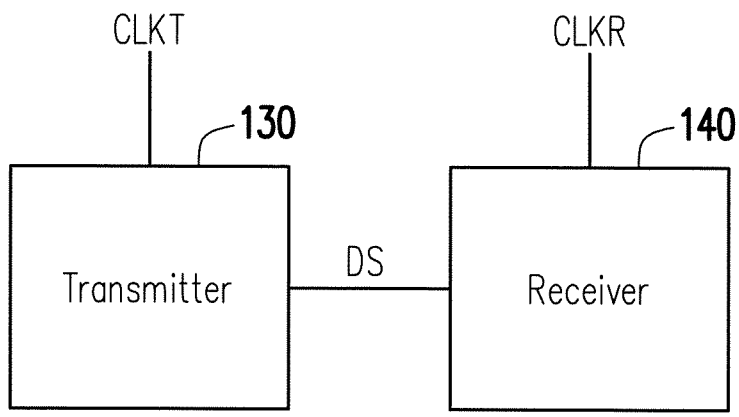
FIG. 1B illustrates a block diagram of the asynchronous data transmission scheme.
Figure 2:
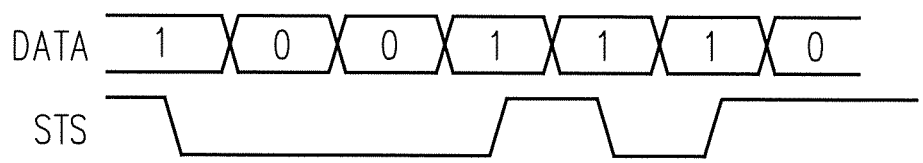
FIG. 2 illustrates a waveform plot of a serially transmitted signal according to an embodiment of present disclosure.

Please referring to FIG. 2, FIG. 2 illustrates a waveform plot of a serially transmitted signal according to an embodiment of present disclosure. In FIG. 2, the serially transmitted signal STS may be encoded according to transmitting data DATA. The encoding method for encoding the transmitting data DATA may include non-return to zero (NRZ) scheme, Manchester scheme, AMI (Alternate Mark Inversion) scheme, MLT-3 (Multilevel Transmission 3) scheme, and Bi-phase encoding scheme, but not limited to. In FIG. 2, the transmitting data DATA is encoded according to non-return-to-zero, and inverted on ones (NRZI) scheme, and the serially transmitted signal STS can be obtained. Here, if the transmitting data DATA is logic "1", the physical level of corresponding serially transmitted signal STS may be transited, and if the transmitting data DATA is logic "0", the physical level of corresponding serially transmitted signal STS is not transited.

Figure 3:
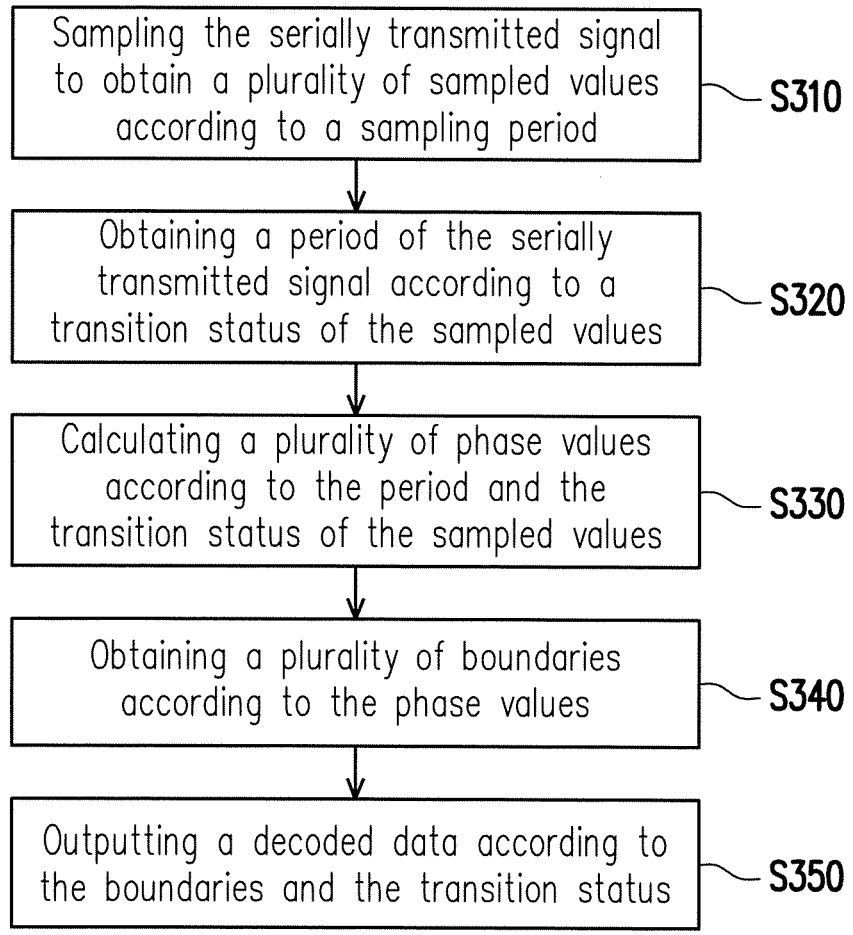
FIG. 3 illustrates a flow chart of a method for decoding the serially transmitted signal according to an embodiment.
Figure 4A:
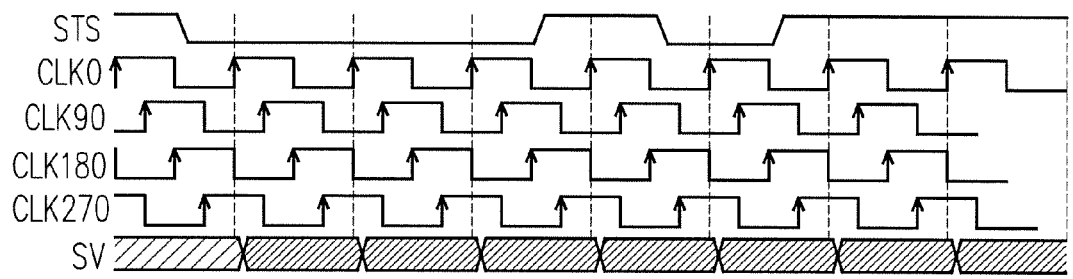
FIG. 4A and FIG. 4B respectively illustrate two waveform plots for sampling the serially transmitted signal according to different embodiments of present disclosure.

Please referring to FIG. 3, FIG. 3 illustrates a flow chart of a method for decoding the serially transmitted signal according to an embodiment. In step S310, the serially transmitted signal is sampled, and a plurality of sampled values can be obtained according to a sampling period. In detail about the step S310, referring to FIG. 4A and FIG. 4B, FIG. 4A and FIG. 4B respectively illustrate two waveform plots for sampling the serially transmitted signal according to different embodiments of present disclosure. In FIG. 4A, the serially transmitted signal STS may be sampled by a plurality of clock signals CLK0, CLK90, CLK180 and CLK270. Clock frequencies of the clock signals CLK0, CLK90, CLK180 and CLK270 may be the same, and phases of the clock signals CLK0, CLK90, CLK180 and CLK270 are different. The serially transmitted signal STS may sampled by rising edges (or failing edges) of the clock signals CLK0, CLK90, CLK180 and CLK270, respectively, and a plurality of sampled values SV can be obtained. In this embodiment, the sampled period equals to TCLK/4, wherein TCLK is a period of one of the clock signals CLK0, CLK90, CLK180 and CLK270.

Figure 4B:

In FIG. 4B, the serially transmitted signal STS may be merely sampled by a clock signal CLKX. The clock frequency of the clock signal CLKX may be higher than the clock signal CLK0. The serially transmitted signal STS may be sampled by rising edges (or failing edges) of the clock signal CLKX, and a plurality of sampled values SV can be obtained, too.

Figure 5:
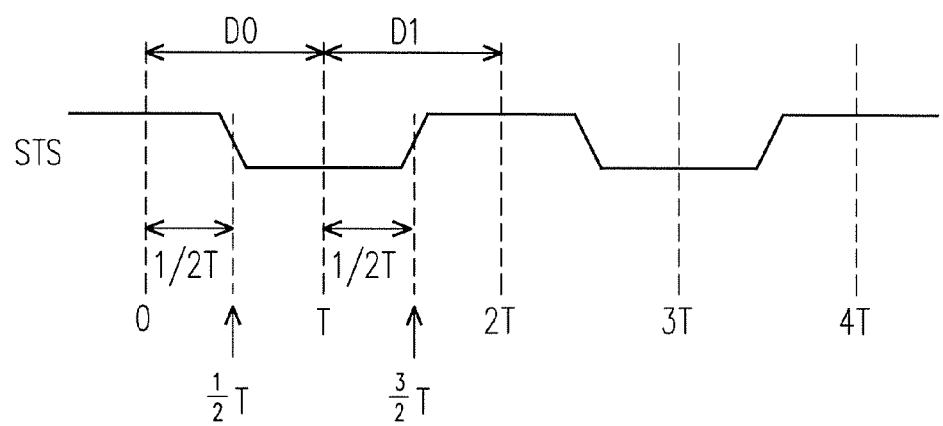
FIG. 5 illustrates a waveform plot of predetermined patterns of the serially transmitted signal according to an embodiment of present disclosure.

Please referring to FIG. 5, FIG. 5 illustrates a waveform plot of predetermined patterns of the serially transmitted signal according to an embodiment of present disclosure. In presented disclosure, it is not necessary to sample all of the serially transmitted signal. In real application, a plurality of predetermined patterns may be inserted into the serially transmitted signal STS during an encoding operation. The predetermined patterns are sending before sending data on the serially transmitted signal STS and to be a preamble of the serially transmitted signal STS. The sampling operation of the step S310 may be operated on the predetermined patterns of the serially transmitted signal STS.

In FIG. 5, during a period between times 0-T, T-2T, 2T-3T, or 3T-4T . . . , each of the transition time points of the serially transmitted signal STS is occurred at half time point of corresponding period. For example, the transition time point corresponding to data D0 is at time point T×½, and the transition time point corresponding to data D1 is at time point T×3/2.

Figure 6:
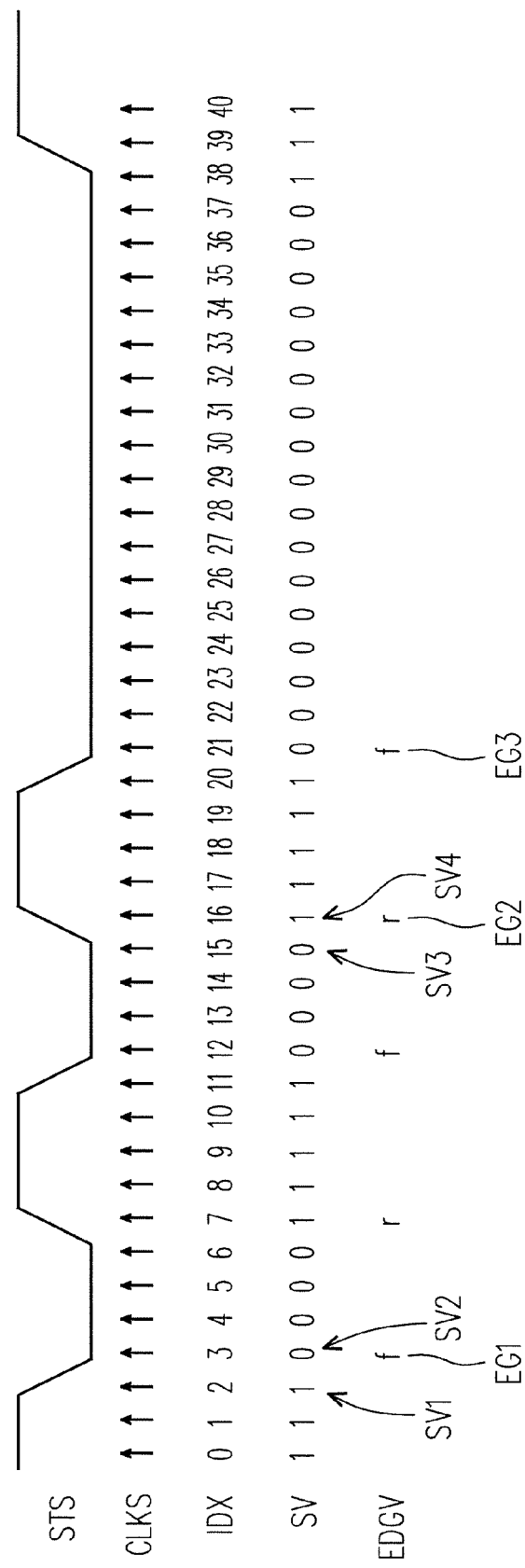
FIG. 6 illustrates a waveform plot for obtaining period of the serially transmitted signal according to an embodiment of present disclosure.

Since the period T of the serially transmitted signal STS is unknown, such as that, step S320 is operated for obtaining the period of the transmitted signal according to a transition status of the sampled values. Please referring to FIG. 6, FIG. 6 illustrates a waveform plot for obtaining period of the serially transmitted signal according to an embodiment of present disclosure. In FIG. 6, the serially transmitted signal STS of FIG. 5 is sampled by one or more clock signals CLKS, and a plurality of sampled values can be obtained. Each of the sampled values SV may be directed to logic "1" or logic "0". Furthermore, the sampled values SV may be respectively indexed by generating a plurality of index values. The index values respectively correspond to the sampled values SV, and the index values may form an arithmetic sequence.

On the other hand, a plurality of edge values EDGV may be determined according to variations of two directly neighbored sampled values. The edge values EDGV represent a transition status of the serially transmitted signal STS. For example, since the sampled vale SV1 (=1) and the sampled value SV2 (=0) are different (varied), a corresponding edge value EG1 with value "f" can be generated. Since the sampled vale SV3 (=0) and the sampled value SV4 (=1) are different (varied), a corresponding edge value EG2 with value "r" can be generated. The value "f" indicates the edge value EG1 corresponds to a failing edge, and the value indicates the edge value EG2 corresponds to a rising edge.

Then, two edge values may be selected, and a difference values between two index values respectively corresponding to the two selected edge values (the Ath edge value and the Bth edge value) may be calculated. Take edge values EG1 (B=1) and EG3 (A=5) as example, the index values respectively correspond to the edge values EG1 and EG3 are 3 and 21, and the difference value=21−3=18. The difference value (=10) is further divided by A−B=5−1=4, the period T=18/4=4.5 can be obtained.

Please referring to FIG. 3 again, step S140 is executed for calculating a plurality of phase values according to the period and the transition status of the sampled values. In detail of the step S140, please referring to FIG. 7, wherein FIG. 7 illustrates a waveform plot for obtaining phase values and boundaries of the serially transmitted signal according to an embodiment of present disclosure.

Figure 7:
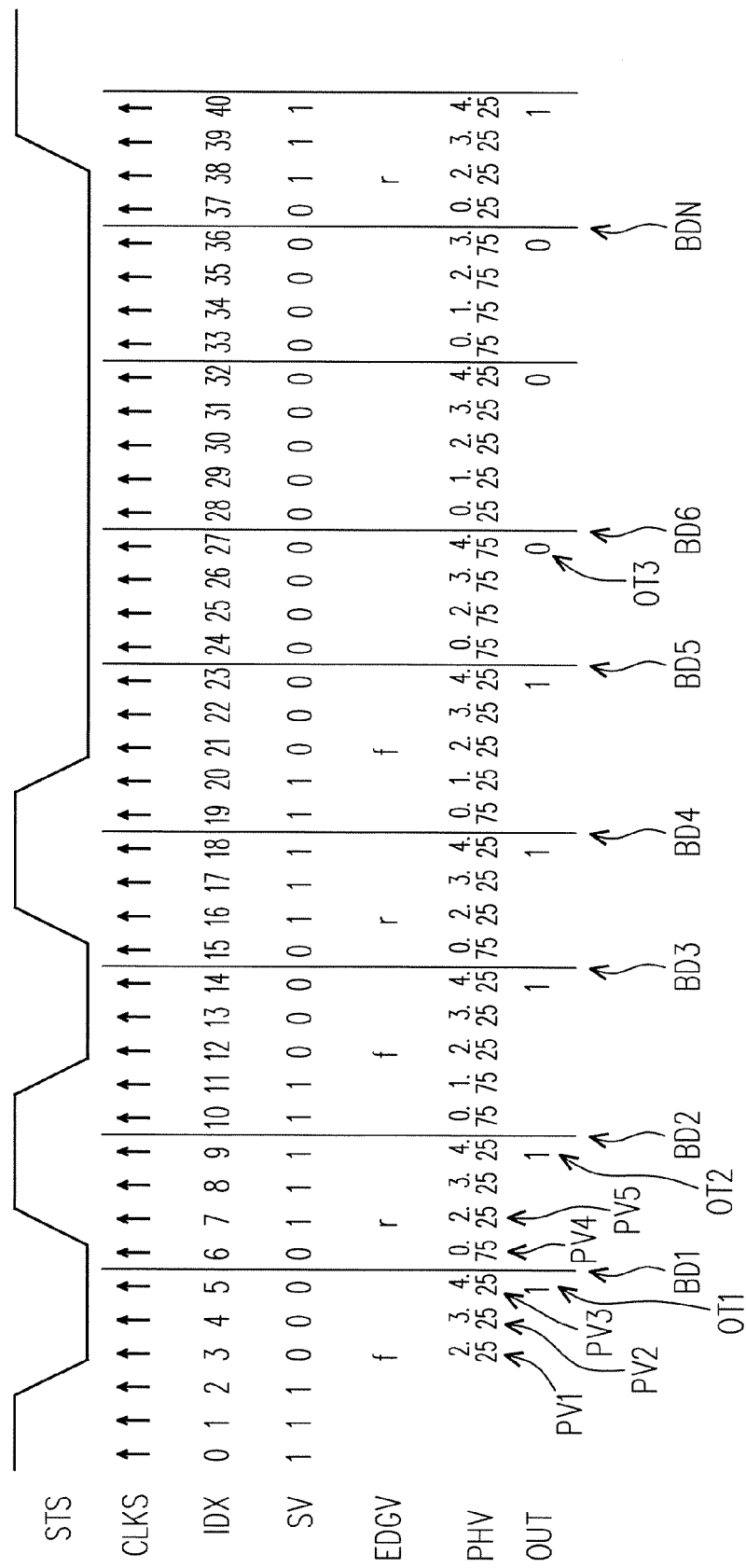
FIG. 7 illustrates a waveform plot for obtaining phase values and boundaries of the serially transmitted signal according to an embodiment of present disclosure.

In FIG. 7, the phase values are calculated according to the period T and the transition status (the edge values EDGV) of the sampled values SV. In detail, each of the phase values PHV(N) can be represented as formula (1):

$$PHV(N)$$

$$= \tfrac{1}{2} \times T, \text{ if corresponding sampled value is an edge}$$

$$= (PHV(N-1)+1)\% T, \text{ if corresponding sampled value is not an edge} \quad (1)$$

Wherein, in formula (1), the operator % is used to obtain a residue of a division equation.

According to the formula (1), a plurality of phase values PHV can be obtained. For example, the phase value PV1 corresponding to the sampled value with value "0" is a failing edge, the phase value PV1=½×4.5=2.25. The phase value PV5 corresponding to the sampled value with value "1" is a rising edge, the phase value PV5=½×4.5=2.25. Furthermore, the phase value PV2 corresponding to the sampled value which is not an edge, the phase value PV2=(2.25+1) % 4.5=3.25. The phase value PV4 corresponding to the sampled value which is not an edge, the phase value PV4=(4.25+1) % 4.5=0.75.

Please referring to FIG. 3 again, after the phase values PHV are determined, step S340 is executed for obtaining a plurality of boundaries according to the phase values PHV. Referring to FIG. 7, each of the boundaries BD1-BDN can be determined according to each of the phase values and the period T. If the phase value+1 is larger than or equal to the period T, a boundary corresponding to the phase value can be determined. For example, the phase value PV3+1=5.25 is larger than the period T (4.5), the boundary BD1 can be determined. For the same reason mentioned above, the boundaries BD2-BDN can be determined according to the phase values PHV.

After the boundaries have been determined, step S350 in FIG. 3 can be executed for outputting decoded data OUT according to the boundaries and the transition status. In detail of the step S350, the output data OUT includes a plurality of data bits, and each of the data bits can be determined by checking whether any edge value occurred between two continues boundaries. For example, in FIG. 7, an edge value "f" is occurred before the boundary BD1, a data bit OT1 with logic is generated. Another edge value "r" is occurred between the boundaries BD1 and BD2, another data bit OT2 with logic "1" is generated. Furthermore, there is no any edge value can be found between the boundaries BD5 and BD6, a data bit OT3 with logic "0" can be generated.

Figure 8:
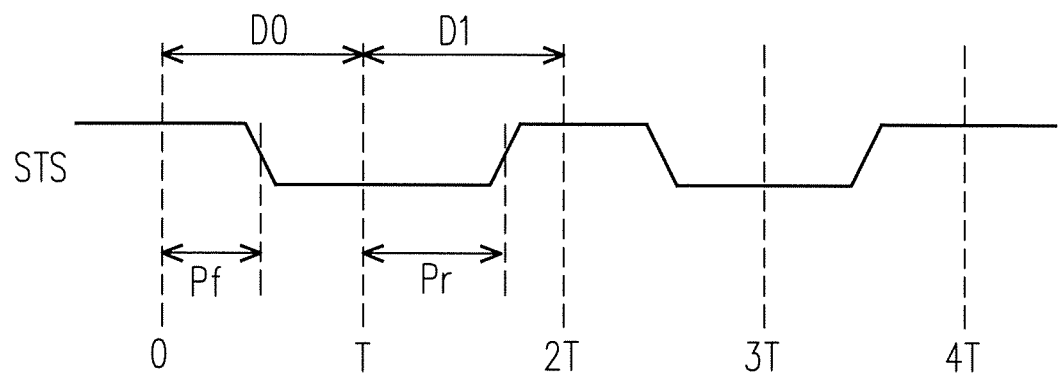
FIG. 8 illustrates a waveform plot of predetermined patterns of the serially transmitted signal according to another embodiment of present disclosure.

Please referring to FIG. 8, FIG. 8 illustrates a waveform plot of predetermined patterns of the serially transmitted signal according to another embodiment of present disclosure. Different from FIG. 5, the serially transmitted signal STS in FIG. 7 doesn't transit at middle time pint of one period. Additional, a first time length (a rising value Pr) between rising edge and start time point of one period and a second time length (a failing value Pf) between failing edge and start time point of one period can be different.

Figure 9:
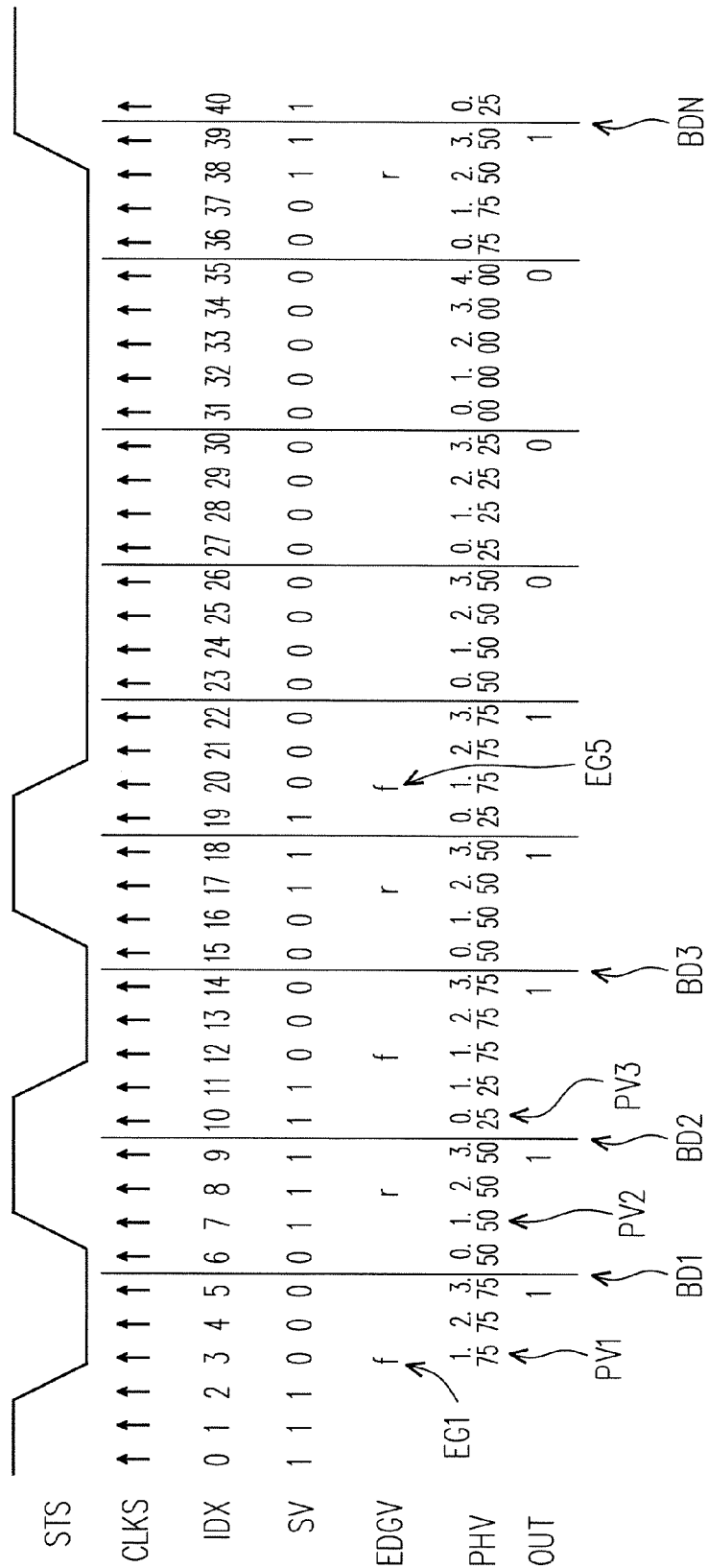
FIG. 9 illustrates a waveform plot for decoding the serially transmitted signal in FIG. 8 according to an embodiment of present disclosure.

Please referring to FIG. 9, FIG. 9 illustrates a waveform plot for decoding the serially transmitted signal in FIG. 8 according to an embodiment of present disclosure. In FIG. 9, the serially transmitted signal STS is sampled by one or more clock signal CLKS with sampled period to obtain a plurality of sampled values SV. The sampled values SV may be respectively indexed by the index values IDX, and a plurality of edge values EDGV in the transition status of the serially transmitted signal STS can be determined according to the sampled values SV.

For calculating the period T of the serially transmitted signal STS, two edge values (the edge values EG1 and EG5) may be selected, and a difference values between two index values (3 and 20) respectively corresponding to the two selected edge values may be calculated. Such as that, the period T=(20−3)/(5−1)=4.25 can be obtained.

It should be noted here, in this embodiment, since the rising value Pr and the failing value Pf are different, the rising value Pr and the failing value Pf can be calculated separately. Here, the failing value Pf is obtained by calculating number of 1s between a Cth edge value and a Dth edge value, and dividing the number of 1 s by (C-D), and the rising value Pr is obtained by calculating number of 0s between the Cth edge value and the Dth edge value, and dividing the number of 0s by (C-D). For example, if C and D are respectively 5 and 1, the failing value Pf=7/4=1.75, and the rising value Pr=10/4=2.25.

Furthermore, the phase values are calculated according to the period T, the rising value Pr, the failing value Pf, and the transition status (the edge values EDGV) of the sampled values SV. In detail, each of the phase values PHV(N) can be represented as formula (2):

PHASE($N$)=

$Pr$, if corresponding sampled value is rising edge $Pf$, if corresponding sampled value is failing edge $(PHV(N-1)+1)\%T$, if corresponding sampled value is not an edge (2)

Wherein, in formula (2), the operator % is used to obtain a residue of a division equation.

According to the formula (2), a plurality of phase values PHV can be obtained. For example, the phase value PV1 corresponding to the sampled value with value "0" is a failing edge, the phase value PV1=Pf=1.75. The phase value PV5 corresponding to the sampled value with value "1" is a rising edge, the phase value PV5=½×4.5=2.25. Furthermore, the phase value PV2 corresponding to the sampled value which is a rising edge, the phase value PV2=Pr=2.25. The phase value PV3 corresponding to the sampled value which is not an edge, the phase value PV3=(3.50+1) % 4.25=0.25.

According to the phase values PHV, boundaries BD1-BDN can be determined by executing the step S340 in FIG. 3. Each of the boundaries BD1-BDN can be determined according to each of the phase values and the period T. If the phase value+1 is larger than or equal to the period T, a boundary corresponding to the phase value can be determined. After the boundaries have been determined, step S350 in FIG. 3 can be executed for outputting decoded data OUT according to the boundaries and the transition status. Each of the data bits of the outputting decoded data OUT can be determined by checking whether any edge value occurred between two continues boundaries.

Figure 10:
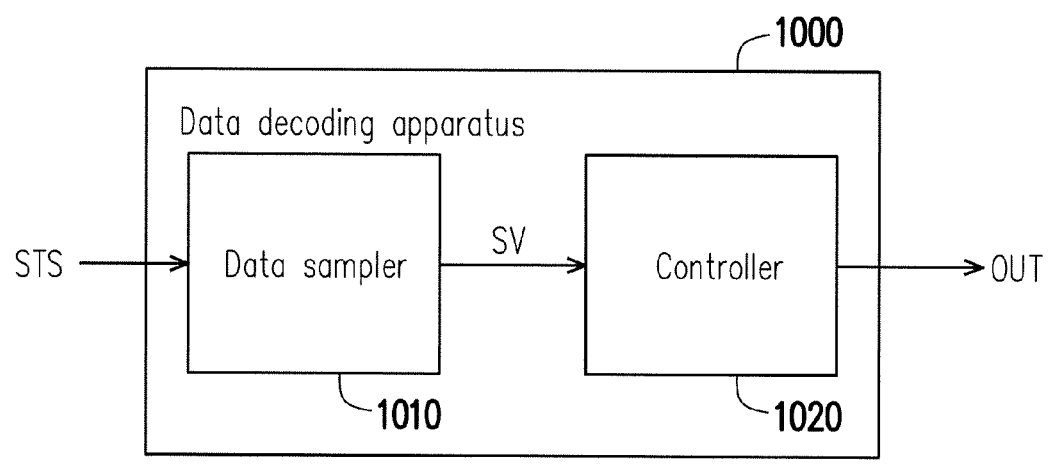
FIG. 10 illustrates a schematic diagram of a data decoding apparatus according to an embodiment of present disclosure.

Please referring to FIG. 10, FIG. 10 illustrates a schematic diagram of a data decoding apparatus according to an embodiment of present disclosure. The data decoding apparatus 1000 includes a data sampler 1010 and a controller 1020. The data sampler 1010 is coupled to the controller 1020. The data sampler 1010 receives a serially transmitted signal STS. The serially transmitted signal STS may be transmitted from a transmitter and the serially transmitted signal STS is obtained by encoding transmitting data. The data sampler 1010 samples the serially transmitted signal STS to obtain a plurality of sampled values SV. The data sampler 1010 may use one or more clock signals to sample the serially transmitted signal STS according to a sampling period. In hardware structure, the data sampler 1010 may include one or more D-type flip-flops to execute the sampling operation. Of course, the data sampler 1010 may also be implemented by any other hardware structure known by a person skilled in the art.

The controller 1020 receives the sampled values SV, and the controller 1020 can be configured to execute the steps S320-S350 illustrated in FIG. 3, and decoded data OUT can be generated.

On the other hand, the controller 1020 may be a circuit which has arithmetic operation capability. The circuit can be a digital circuit, an analog circuit or a mixed mode circuit.

Figure 11:
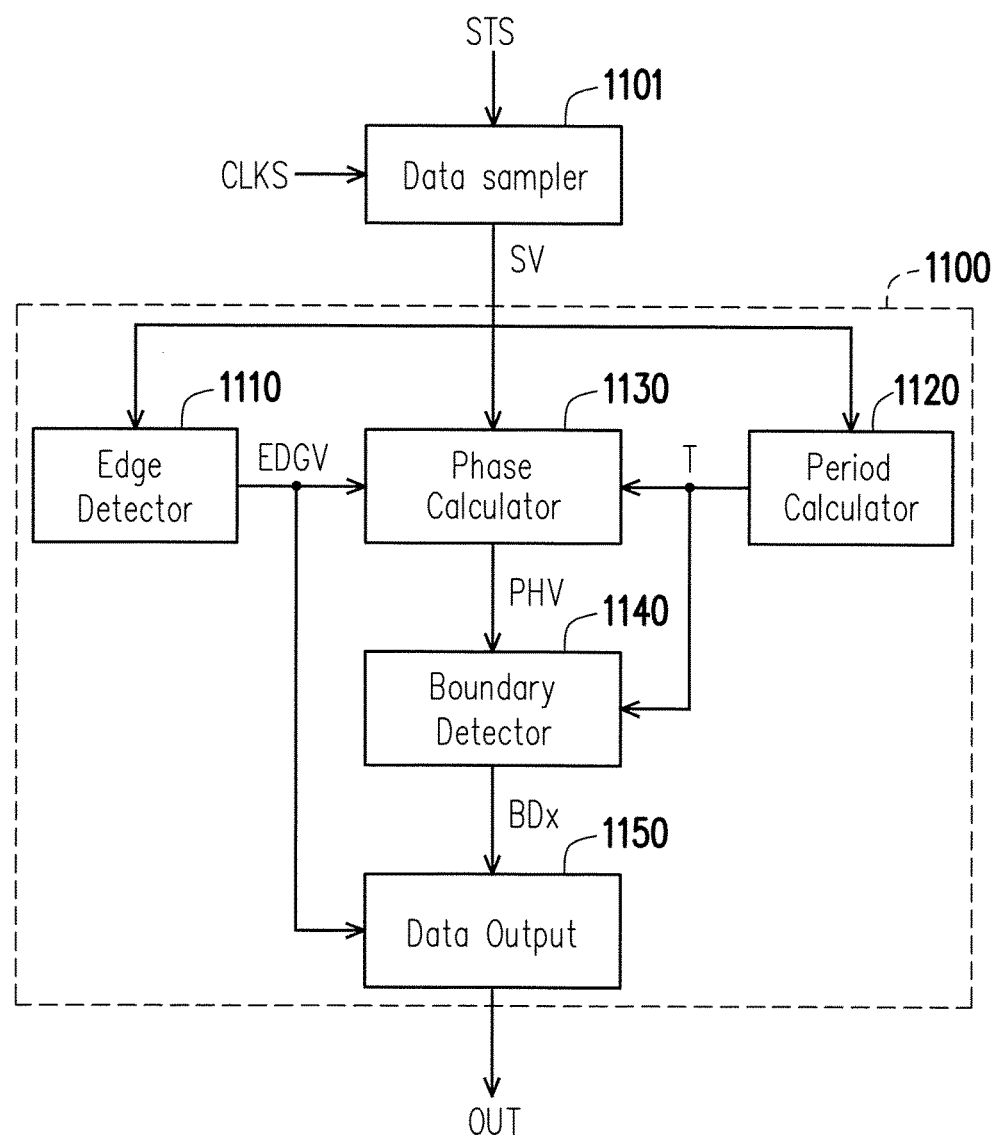
FIG. 11 illustrate a schematic diagram of the controller according to an embodiment of present disclosure.

Please referring to FIG. 11, FIG. 11 illustrate a schematic diagram of the controller according to an embodiment of present disclosure. The controller 1100 is coupled to a data sampler 1101, and includes an edge detector 1110, a phase calculator 1130, a period calculator 1120, a boundary detector 1140 and a data output circuit 1150. The data sampler 1101 samples a serially transmitted signal STS by a clock signal CLKS to generate a sampled values SV. The sampled value SV is transported to the phase detector 1130, the edge detector 1110 and the phase calculator 1120, and the phase detector 1130, the edge detector 1110 can respectively generate the edge values EDGV and the period T. The phase calculator 1120 is coupled to the phase detector 1130 and the edge detector 1110 to receive the edge values EDGV and the period T. The phase calculator 1120 generates the phase values PHV according to the sampled values SV the edge values EDGV and the period T.

The boundary detector 1140 is coupled between the phase calculator and the data output circuit 1150. The boundary detector 1140 receives the phase values PHV and generates the boundaries BDx. The data output circuit 1150 receives the boundaries BDx and the edge values EDGV, and generates the output decoded data OUT according to the boundaries BDx and the edge values EDGV.

Please be noted here, detail operations of the edge detector 1110, the phase calculator 1130, the period calculator 1120, the boundary detector 1140 and the data output circuit 1150 have been described in above embodiments. Structures of the edge detector 1110, the phase calculator 1130, the period calculator 1120, the boundary detector 1140 and the data output circuit 1150 can be implemented by digital circuits. A person skilled in the art can use hardware description language (HDL) or any other well-known digital circuit design scheme to implement the edge detector 1110, the phase calculator 1130, the period calculator 1120, the boundary detector 1140 and the data output circuit 1150 according to corresponding functions. The detail structure of the edge detector 1110, the phase calculator 1130, the period calculator 1120, the boundary detector 1140 and the data output circuit 1150 can be obtained by circuit synthesize tool and are not fixed.

In summary, the data decoding apparatus of present disclosure does not need to know information of a clock signal for encoding the decoded data. The data decoding apparatus can decode the decoded data by calculating the period, the phase values, the edge values and the boundaries according to the sampled values. Such as that, requirement of high bit rate accuracy for the transmitter is not needed.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A method for decoding a serially transmitted signal, comprising:
    sampling the serially transmitted signal to obtain a plurality of sampled values according to a sampling period;
    obtaining a period of the serially transmitted signal according to a transition status of the sampled values;
    calculating a plurality of phase values according to the period and the transition status of the sampled values;
    obtaining a plurality of boundaries according to the phase values; and
    outputting decoded data according to the boundaries and the transition status.

2. The method as claimed in claim 1, wherein step of sampling the serially transmitted signal to obtain the sampled values according to the sampling period comprising:
    sampling a plurality of predetermined patterns of the serially transmitted signal by a sampling clock with the sampling period,
    wherein, the predetermined patterns are sending before sending data on the serially transmitted signal.

3. The method as claimed in claim 1, wherein step of sampling the serially transmitted signal to obtain the sampled values according to the sampling period comprising:
    sampling a plurality of predetermined patterns of the serially transmitted signal by a plurality of sampling clocks,
    wherein, the predetermined patterns are sending before sending data on the serially transmitted signal.

4. The method as claimed in claim 1, wherein the transition status comprises a plurality of edge values, and each of the edge values is determined according to a variation of a first sampled value and a second sampled value, wherein the first sampled value directly neighbors to the second sampled value.

5. The method as claimed in claim 4, wherein step of sampling the serially transmitted signal to obtain the sampled values according to the sampling period further comprises:
    generating a plurality index values respectively correspond to the sampled values, wherein the index values form an arithmetic sequence;
    and step of the obtaining the period of the serially transmitted signal according to the transition status of the sampled values comprises:
    calculating a difference value of two index values respectively corresponding to a Ath edge value and a Bth edge value, and dividing the difference value by (A-B) to obtain the period of the serially transmitted signal.

6. The method as claimed in claim 5, wherein step of calculating the phase values according to the period and the transition status of the sampled values comprises:
    setting each of the phase values PHASE(N)=one half of the period T of the serially transmitted signal if each of the phase values PHASE(N) corresponding to one of the edge values; and
    setting each of the phase values PHASE(N)=a residue value of ((PHASE(N−1)+1)/T) if none edge value corresponding to each of the phase values PHASE(N).

7. The method as claimed in claim 5, wherein step of calculating the phase values according to the period and the transition status of the sampled values comprises:
    calculating number of 1s between a Cth edge value and a Dth edge value, and dividing the number of 1s by (C-D) to obtain a falling value Pf;
    calculating number of 0s between the Cth edge value and the Dth edge value, and dividing the number of 0s by (C-D) to obtain a rising value Pr;
    setting each of the phase values PHASE(N)=Pr if one of the edge values corresponding to each of the phase values PHASE(N) is rising edge;
    setting each of the phase values PHASE(N)=Pf if one of the edge values corresponding to each of the phase values PHASE(N) is failing edge; and
    setting each of the phase values PHASE(N)=a residue value of ((PHASE(N−1)+1)/T) if none edge value corresponding to each of the phase values PHASE(N).

8. The method as claimed in claim 1, wherein step of obtaining the boundaries according to the phase values comprises:
    obtaining each of the boundaries by checking whether each of the phase values is less than the period of the serially transmitted signal or not.

9. The method as claimed in claim 1, wherein step of outputting the decoded data according to the boundaries and the transition status comprises:

checking whether one of a plurality of edge values in the transition status occurred between two continues boundaries.

10. A data decoding apparatus, adapted to decode a serially transmitted signal, comprising:
   a signal sampler, sampling the serially transmitted signal to obtain a plurality of sampled values according to a sampling period; and
   a controller, coupled to the signal sampler, wherein the controller is configure to:
      obtain a period of the serially transmitted signal according to a transition status of the sampled values;
      calculate a plurality of phase values according to the period and the transition status of the sampled values;
      obtain a plurality of boundaries according to the phase values; and
      output decoded data according to the boundaries and the transition status.

11. The data decoding apparatus, as claimed in claim 10, wherein the signal sampler samples a plurality of predetermined patterns of the serially transmitted signal by a sampling clock with the sampling period,
   wherein, the predetermined patterns are sending before sending data on the serially transmitted signal.

12. The data decoding apparatus, as claimed in claim 10, wherein the signal sampler samples a plurality of predetermined patterns of the serially transmitted signal by a plurality of sampling clocks,
   wherein, the predetermined patterns are sending before sending data on the serially transmitted signal.

13. The data decoding apparatus, as claimed in claim 10, wherein the transition status comprises a plurality of edge values, and each of the edge values is determined according to a variation of a first sampled value and a second sampled value by the controller, wherein the first sampled value directly neighbors to the second sampled value.

14. The data decoding apparatus, as claimed in claim 13, wherein the controller is further configured to generate a plurality index values respectively correspond to the sampled values, wherein the index values form an arithmetic sequence, calculate a difference value of two index values respectively corresponding to a Ath edge value and a Bth edge value, and divide the difference value by (A-B) to obtain the period of the serially transmitted signal.

15. The data decoding apparatus, as claimed in claim 14, wherein the controller is further configured to:
   set each of the phase values PHASE(N)=one half of the period T of the serially transmitted signal if each of the phase values PHASE(N) corresponding to one of the edge values; and
   set each of the phase values PHASE(N)=a residue value of ((PHASE(N−1)+1)/T) if none edge value corresponding to each of the phase values PHASE(N).

16. The data decoding apparatus, as claimed in claim 14, wherein the controller is further configured to:
   calculate number of 1 s between a Cth edge value and a Dth edge value, and dividing the number of 1s by (C-D) to obtain a falling value Pf;
   calculate number of 0s between the Cth edge value and the Dth edge value, and dividing the number of 0s by (C-D) to obtain a rising value Pr;
   set each of the phase values PHASE(N)=Pr if one of the edge values corresponding to each of the phase values PHASE(N) is rising edge;
   set each of the phase values PHASE(N)=Pf if one of the edge values corresponding to each of the phase values PHASE(N) is failing edge; and
   set each of the phase values PHASE(N)=a residue value of ((PHASE(N−1)+1)/T) if none edge value corresponding to each of the phase values PHASE(N).

17. The data decoding apparatus, as claimed in claim 10, wherein the controller is further configured to:
   obtain each of the boundaries by checking whether each of the phase values is less than the period of the serially transmitted signal or not.

18. The data decoding apparatus, as claimed in claim 10, wherein the controller is further configured to:
   check whether one of a plurality of edge values in the transition status occurred between two continues boundaries.

* * * * *